United States Patent
Lee

(10) Patent No.: US 6,282,128 B1
(45) Date of Patent: Aug. 28, 2001

(54) INTEGRATED CIRCUIT MEMORY DEVICES HAVING MULTIPLE DATA RATE MODE CAPABILITY AND METHODS OF OPERATING SAME

(75) Inventor: Sang-bo Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/576,987

(22) Filed: May 23, 2000

Related U.S. Application Data

(62) Division of application No. 09/223,541, filed on Dec. 30, 1998, now Pat. No. 6,094,375.

(30) Foreign Application Priority Data

Dec. 30, 1997 (KR) .................................................. 97-77743

(51) Int. Cl.$^7$ ...................................................... G11C 7/00
(52) U.S. Cl. ................................. 365/189.04; 365/189.02; 365/233
(58) Field of Search ........................ 365/189.02, 189.04, 365/189.05, 238, 233, 238.5, 230.04

(56) References Cited

U.S. PATENT DOCUMENTS 5,818,785 * 10/1998 Ohshima ........................ 365/230.03
6,094,375 * 7/2000 Lee ................................... 365/189.04
6,097,640 * 8/2000 Fei et al. ......................... 365/189.02
6,151,271 * 11/2000 Lee ....................................... 365/233

* cited by examiner

Primary Examiner—Son Mai
(74) Attorney, Agent, or Firm—Myers Bigel Sibley & Sajovec

(57) ABSTRACT

Integrated circuit memory devices which are operable in both single and dual data rate modes (depending on the value of a mode select signal), include first and second memory cell arrays and first and second global input/output signal lines (GIOF, GIOS) electrically coupled to the first and second memory cell arrays, respectively. Decoder and data transmission circuits are provided and these circuits are responsive to the mode select signal and column address signals. These circuits enable operation in both single and dual data rate modes and perform the functions of simultaneously transferring read data on the first and second global input/output lines to first and second data lines, respectively, during a first read time interval when a first column address signal is in a first logic state and simultaneously transferring read data on said first and second global input/output lines to the second and first data lines, respectively, during a second read time interval when the first column address signal is in a second logic state opposite the first logic state.

23 Claims, 15 Drawing Sheets

INTEGRATED CIRCUIT MEMORY DEVICES HAVING MULTIPLE DATA RATE MODE CAPABILITY AND METHODS OF OPERATING SAME

This application is a division of Ser. No. 09/223,541 Dec. 30, 1998 U.S. Pat. No. 6,094,375

FIELD OF THE INVENTION

The present invention relates to integrated circuit devices and methods of operating integrated circuit devices, and more particularly to integrated circuit memory devices and methods of operating integrated circuit memory devices.

BACKGROUND OF THE INVENTION

Computer systems typically include a central processing unit (CPU) for performing commands and a main memory for storing data and programs required by the CPU. Thus, increasing the operational speed of the CPU and reducing the access time of the main memory can enhance the performance of the computer system. As will be understood by those skilled in the art, a synchronous DRAM (SDRAM) operates according to control of a system clock and typically provides a short access time when uses as a main memory.

In particular, the operation of the SDRAM is controlled in response to pulse signals generated by transitions of a system clock. Here, the pulse signals are generated during a single data rate SDR mode or a dual data rate DDR mode. The SDR mode generates pulse signals with respect to transitions in one direction (e.g., pulse signals of 'high' to 'low' or vice versa) to operate a DRAM device. However, the DDR mode generates pulse signals with respect to transitions in both directions (e.g., pulse signals of 'high' to 'low' and vice versa) to operate the DRAM device.

The DDR mode enables a memory device to have wide bandwidth operation. Thus, the DDR mode is very helpful when making an ultra-high speed SDRAM. However, to implement the DDR mode, the layout area of the memory device typically must be increased because twice as many data lines may need to be provided. Also, in the DDR mode compared with the SDR mode, set-up time and data hold time between data and the clock during reading and writing are reduced, so that auxiliary circuits for delaying an external clock are often necessary. This requirement may lead to further increase in the size of the memory chip. Therefore, only memory devices for ultra-high speed systems typically utilize the DDR mode, whereas other memory devices typically utilize the SDR mode.

Notwithstanding these known aspects of conventional memory devices, there continues to exist a need for improved memory devices and methods of operating same.

SUMMARY OF THE INVENTION

It is therefore an object of the present invention to provide improved integrated circuit memory devices and methods of operating same.

It is another object of the present invention to provide integrated circuit memory devices which have the capability of reading and writing data in both single and dual data rate modes and methods of operating same.

These and other objects, features and advantages of the present invention are provided by integrated circuit memory devices which are operable in both single and dual data rate modes depending on the value of a mode select signal (PSDR). According to a preferred embodiment of the present invention, an integrated circuit memory device includes first and second memory cell arrays and first and second global input/output signal lines (GIOF, GIOS) electrically coupled to the first and second memory cell arrays, respectively. In addition, decoder and data transmission circuits are provided and these circuits are responsive to the mode select signal and column address signals. These circuits also enable operation in both single and dual data rate modes. In particular, during a dual data rate mode, these circuits perform the functions of simultaneously transferring read data on the first and second global input/output lines to first and second data lines, respectively, during a first read time interval when a first column address signal is in a first logic state (e.g., logic 0) and for simultaneously transferring read data on said first and second global input/output lines to the second and first data lines, respectively, during a second read time interval when the first column address signal is in a second logic state (e.g. logic 1). These circuits preferably include a first output transfer circuit having an input electrically coupled to the first global input/output signal line and first and second outputs electrically coupled to the first and second data lines, respectively, and a second output transfer circuit having an input electrically coupled to the second global input/output signal line and first and second outputs electrically coupled to the first and second data lines, respectively. First and second input drivers are also provided. The first input driver has an input electrically coupled to the first data line (but not the second data line) and first and second outputs electrically coupled to the first and second global input/output lines, respectively. The second input driver has an input electrically coupled to the second data line (but not the first data line) and first and second outputs electrically coupled to the first and second global input/output lines, respectively.

According to another embodiment of the present invention, a preferred method of operating an integrated circuit memory device having first and second memory arrays therein includes the steps of simultaneously transferring read data from the first and second memory arrays to the first and second data lines, respectively, during a first read time interval, in response to a first address signal in a first logic state, and simultaneously transferring read data from the first and second memory arrays to the second and first data lines, respectively, during a second read time interval, in response to the first address signal in a second logic state opposite the first logic state. These steps are performed during a dual data rate mode. In addition, during a single data rate mode, steps are performed to transfer read data from the first memory array to the first data line, in response to the first address signal in the first logic state and transfer read data from the second memory array to the first data line, in response to the first address signal in the second logic state.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
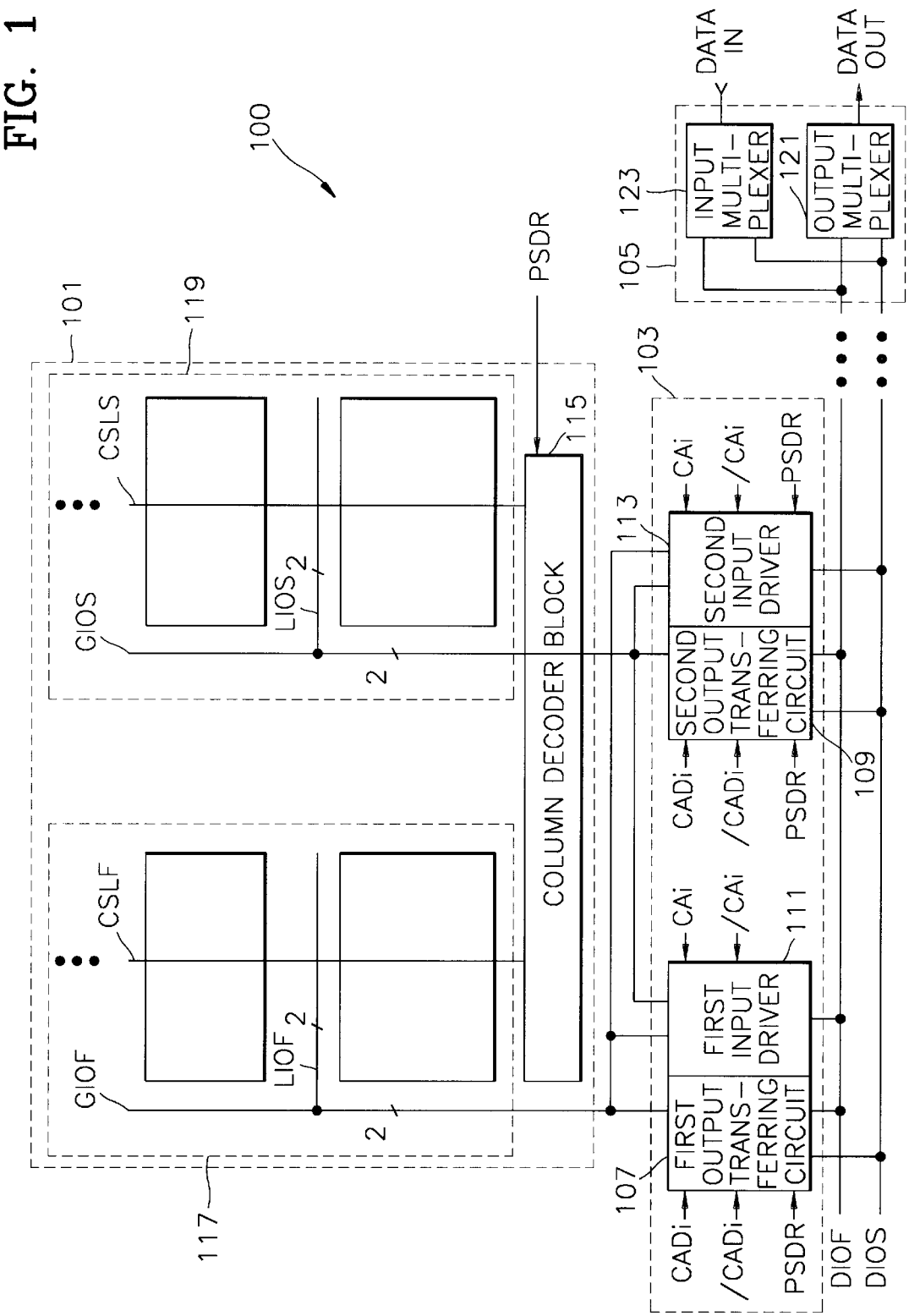
FIG. 1 is a block schematic of an integrated circuit memory device according to an embodiment of the present invention.

Referring now to FIG. 1, a block diagram of an embodiment of an integrated circuit memory device according to the present invention will be described. In particular, FIG. 1 illustrates an integrated circuit memory device 100 which can be configured to operate in either a single data rate (SDR) mode or a dual data rate (DDR) mode. The illustrated memory device 100 includes a core memory section 101, a data transmission section 103 and an input/output control section 105. The core memory section 101 includes a first memory cell array 117, a second memory cell array 119 and a column decoder block 115 which is electrically coupled to the first and second memory cell arrays 117 and 119 by respective pluralities of column select signal lines. These column select signal lines include a first column select signal line (CSLF) associated with the first memory cell array 117 and a second column select signal line (CSLS) associated with the second memory cell array 119. The data transmission section 103 is also electrically coupled to the first and second memory cell arrays 117 and 119 by first and second global I/O signal buses GIOF and GIOS, respectively. As will be understood by those skilled in the art, the first and second global I/O signal buses GIOF and GIOS may be electrically coupled to blocks of memory cells in each array by local I/O signal buses (LIOF, LIOS). In addition, the input/output control section 105 may be electrically coupled to the data transmission section 103 by first and second data I/O lines DIOF and DIOS, as illustrated.

The data transmission section 103 also preferably comprises first and second data output transfer circuits 107 and 109 and first and second data input driver circuits 111 and 113. Here, the first input driver circuit 111 is responsive to a first column address signal CAi (e.g., a most significant bit of a column address CA) and a complementary first column address signal /CAi. The first input driver circuit 111 has an input electrically connected to the first data I/O line DIOF, an output electrically coupled to the first global I/O signal bus GIOF and another output electrically coupled to the second global I/O signal bus GIOS. The second input driver circuit 113 is responsive to the first column address signal CAi, the complementary first column address signal /CAi and the mode select signal PSDR. The second input driver circuit 113 has an input electrically connected to the second data I/O line DIOS, an output electrically coupled to the second global I/O signal bus GIOS and another output electrically coupled to the first global I/O signal bus GIOF. As described more fully hereinbelow, the binary value of the mode select signal PSDR (logic 1 or logic 0) determines whether the memory device 100 will operate in the single data rate SDR mode or the dual data rate DDR mode. In particular, when the mode select signal PSDR is set to a logic 1 potential the single data rate SDR mode is selected and when the mode select signal PSDR is set to a logic 0 potential the dual data rate DDR mode is selected.

The first and second data output transfer circuits 107 and 109 are both responsive to a delayed first column address signal CADi, a delayed complementary first column address signal /CADi and the mode select signal PSDR. The first data output transfer circuit 107 has an input which receives data (i.e., read data) from the first global I/O signal bus GIOF and outputs which transmit this received data to the first data I/O line DIOF or the second data I/O line DIOS. Similarly, the second output transfer circuit 109 has an input which receives data (i.e., read data) from the second global I/O signal bus GIOS and a pair of outputs which transmit this received data to the second data I/O line DIOS or the first data I/O line DIOF. The input/output control section 105 also comprises an input multiplexer 123 and an output multiplexer 121. As described more fully hereinbelow, these multiplexers control the transfer of data to and from the first and second data I/O lines DIOF and DIOS, in response to the mode select signal PSDR and a plurality of clock signals.

Figure 2:
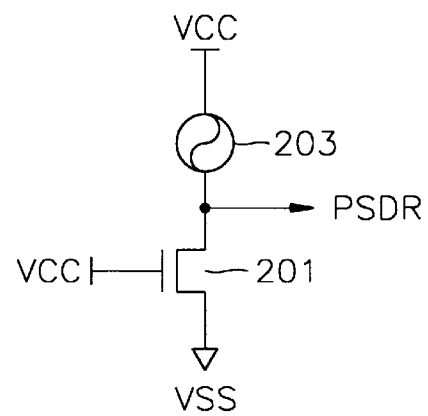
FIG. 2 is an electrical schematic of a preferred mode select signal generator according to the present invention.

Referring now to FIG. 2, a preferred mode select signal generator is illustrated. This generator comprises a fuse 203 and an NMOS transistor 201 electrically connected in series between a power supply potential (e.g., VCC) and a ground reference potential (e.g., VSS). As will be understood by those skilled in the art, an operation to blow the fuse 203 can be performed if the memory device 100 is to be operated in a dual data rate DDR mode, because the presence of a blown fuse will cause the generator to output a logic 0 mode select signal PSDR. Otherwise, if the fuse has is not blown, the generator will output a logic 1 mode select signal PSDR to invoke operation of the memory device 100 in the signal data rate SDR mode. Here, the width of NMOS transistor 201 is designed to be sufficiently narrow to sink only a small pull-down current the fuse 203 is blown.

Figure 3:
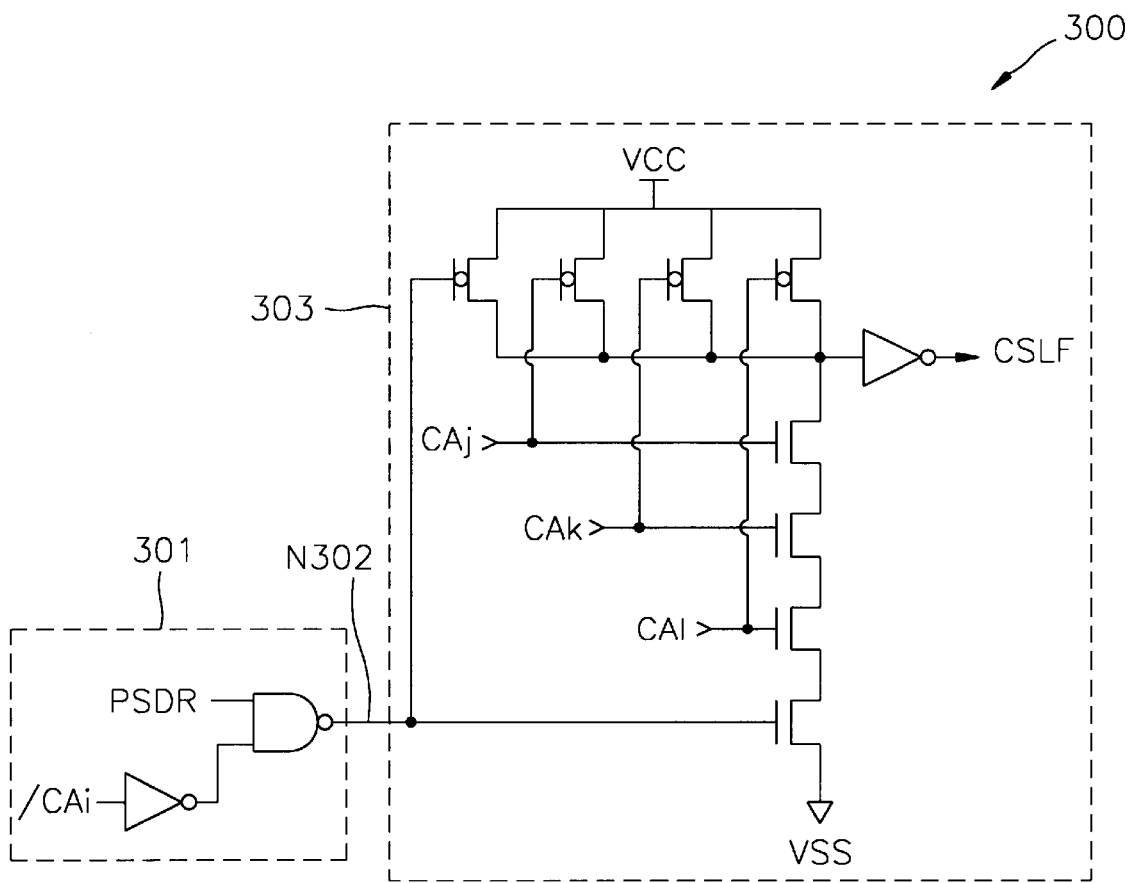
FIG. 3 is an electrical schematic of a first column decoder according to the present invention.
Figure 4:
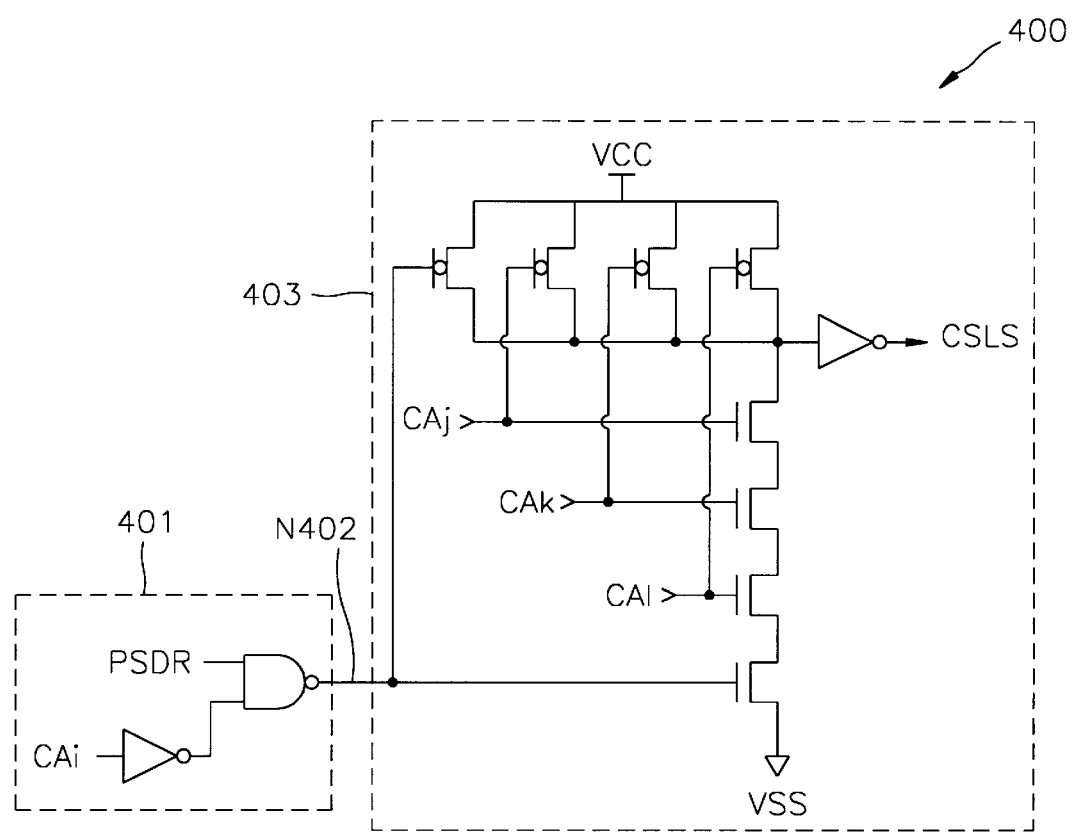
FIG. 4 is an electrical schematic of a second column decoder according to the present invention.

Referring now to FIGS. 3–4, circuits which make up at least a portion of the column decoder block 115 will be described. In particular, the column decoder block 115 includes first and second column decoders 300 and 400. The first and second column decoders 300 and 400 include first and second column select circuits 303 and 403, respectively, which are responsive to a plurality of column address signals (e.g., CAj, CAk and CAl) and generate the first and second column select signals CSLF and CSLS. The plurality of column address signals may represent the least significant bits of the column address CA. First and second rate/address decoders 301 and 401 are also provided and each of these first and second rate/address decoders 301 and 401 has an output which is electrically connected to an input of a respective column select circuit, as illustrated.

According to a preferred aspect of the present invention, the output of the first rate/address decoder 301 at node N302 will be set to a logic 1 potential whenever a dual data rate DDR mode has been selected (i.e., PSDR=logic 0) or whenever a single data rate SDR mode has been selected and the first column address signal CAi is at a logic 0 potential. Similarly, the output of the second rate/address decoder 401 at node N402 will be set to a logic 1 potential whenever a dual data rate DDR mode has been selected (i.e., PSDR=logic 0) or whenever a single data rate SDR mode has been selected and the first column address signal CAi is at a logic 1 potential. Therefore, the illustrated first column select signal line CSLF and second column select signal line CSLS can both be simultaneously enabled during a dual data rate DDR mode of operation (when PSDR=0) if the column address CA (CAi, CAj, CAk, CAl) is set to (X,1,1,1), where "X" denotes either a logic 1 or a logic 0 value. Alternatively, during a single data rate SDR mode of operation (when PSDR=1), the first column select signal line CSLF can be enable if the column address CA is set to (0,1,1,1) and the second column select signal line CSLS can be enabled if the column address CA is set to (1,1,1,1). Thus, the during a single data rate SDR mode of operation, the most significant bit of a column address CA can be used to select whether a particular column in the first memory cell array 117 is to be selected during a reading or writing operation or whether a corresponding column in the second memory cell array 119 is to be selected.

Figure 5:
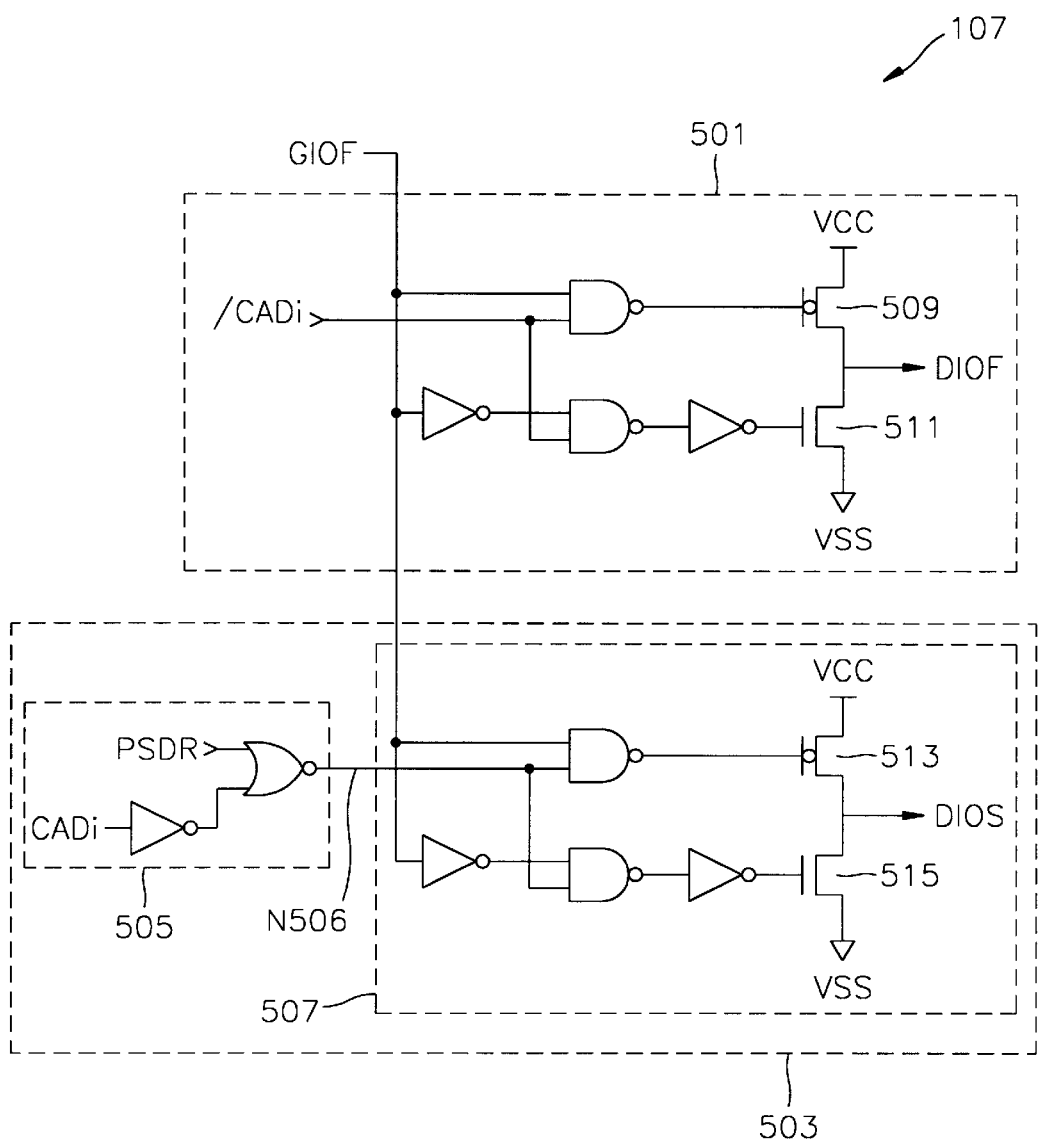
FIG. 5 is an electrical schematic of a first data output transfer circuit according to the present invention.
Figure 6:
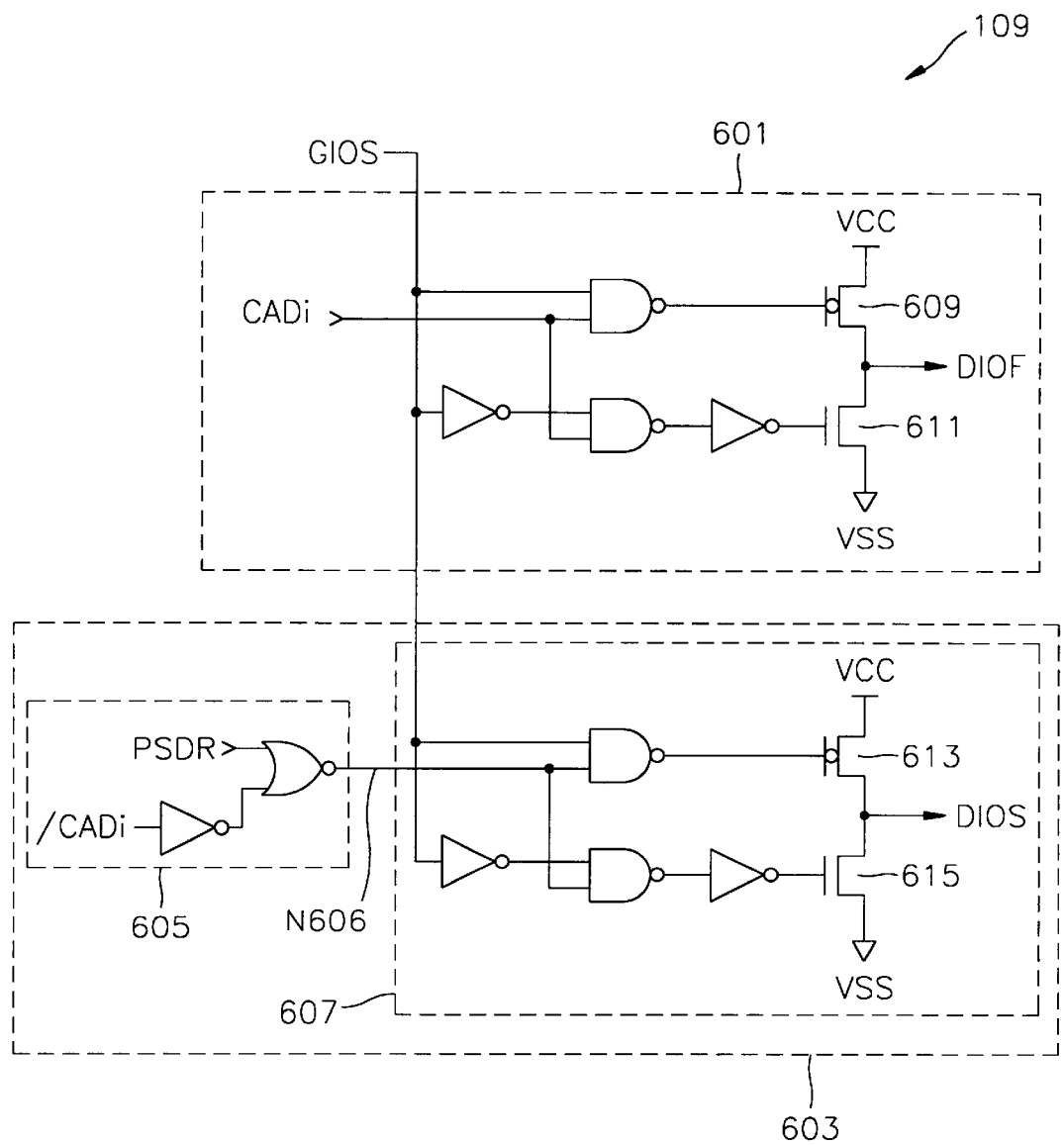
FIG. 6 is an electrical schematic of a second data output transfer circuit according to the present invention.

Referring now to FIGS. 5–6, the first and second data output transfer circuits 107 and 109 will be described. In particular, the first data output transfer circuit 107 includes a first output transmission circuit 501, a second output transmission circuit 507 and a third rate/address decoder 505 having an output connected to an input of the second output transmission circuit 507. As illustrated, when the delayed complementary first column address signal /CADi is set to a logic 1 potential (CADi=0), then data on the first global I/O signal bus GIOF will be transferred to the first data I/O line DIOF in both the single and dual data rate modes. Also, if a single data rate SDR mode has been selected by setting the mode select signal PSDR to a logic 1 potential, then the output of the third rate/address decoder 505 at node N506 will be set to a logic 0 potential and render the output of the second output transmission circuit 507 in a high impedance state by causing a PMOS pull-up transistor 513 and an NMOS pull-down transistor 515 to be turned off simultaneously. Thus, the output of the second output transmission circuit 507 will not influence the potential of the second data I/O line DIOS to which it is connected. To illustrate further, if the read data on the first global I/O signal bus GIOF is at a logic 1 potential when /CADi is at a logic 1 potential, then the PMOS pull-up transistor 509 will be turned on to pull up the first data I/O line DlOF, however, if the read data on the first global I/O signal bus GIOF is at a logic 0 potential when /CADi is at a logic 1 potential, then the NMOS pull-down transistor 511 will be turned on to pull down the first data I/O line DIOF.

Alternatively, when the mode select signal PSDR is set to a logic 0 potential during dual data rate DDR mode operation and CADi is set to a logic 1 potential, then data on the first global I/O signal bus GIOF will be transferred to the second data I/O line DIOS. In particular, if a double data rate DDR mode has been selected by setting the mode select signal PSDR to a logic 0 potential, then setting a delayed first column address signal CADi to a logic 1 potential will drive node N506 to a logic 1 potential, so the read data on the first global I/O signal bus GIOF can be passed to the second data I/O line DIOS via the output of the second output transmission circuit 507. For example, if the read data on the first global I/O signal bus GIOF is at a logic 1 potential, then the PMOS pull-up transistor 513 will be turned on to pull up the second data I/O line DIOS, however, if the read data on the first global I/O signal bus GIOF is at a logic 0 potential, then the NMOS pull-down transistor 515 will be turned on to pull down the second data I/O line DIOS.

Referring now to FIG. 6, the second data output transfer circuit 109 includes a third output transmission circuit 601, a fourth output transmission circuit 607 and a fourth rate/address decoder 605 having an output connected to an input of the fourth output transmission circuit 607. As illustrated, when the delayed first column address signal CADi is set to a logic 1 potential (CADi=1), then data on the second global I/O signal bus GIOS will be transferred to the first data I/O line DIOF in both the single and dual data rate modes. Also, if a single data rate SDR mode has been selected by setting the mode select signal PSDR to a logic 1 potential, then the output of the fourth rate/address decoder 605 at node N606 will be set to a logic 0 potential and render the output of the fourth output transmission circuit 607 in a high impedance state by causing a PMOS pull-up transistor 613 and an NMOS pull-down transistor 615 to be turned off simultaneously. Thus, the output of the fourth output transmission circuit 607 will not influence the potential of the second data I/O line DIOS to which it is connected. To illustrate further, if the read data on the second global I/O signal bus GIOS is at a logic 1 potential when CADi is at a logic 1 potential, then the PMOS pull-up transistor 609 will be turned on to pull up the first data I/O line DlOF, however, if the read data on the second global I/O signal bus GIOS is at a logic 0 potential when CADi is at a logic 1 potential, then the NMOS pull-down transistor 611 will be turned on to pull down the first data I/O line DlOF.

Alternatively, when the mode select signal PSDR is set to a logic 0 potential during dual data rate DDR mode operation and /CADi is set to a logic 1 potential, then data on the second global I/O signal bus GIOS will be transferred to the second data I/O line DIOS. In particular, if a double data rate DDR mode has been selected by setting the mode select signal PSDR to a logic 0 potential, then setting a delayed complementary first column address signal /CADi to a logic 1 potential will drive node N606 to a logic 1 potential. This will enable read data on the second global I/O signal bus GIOS to be passed to the second data I/O line DIOS via the output of the fourth output transmission circuit 607. For example, if the read data on the second global I/O signal bus GIOS is at a logic 1 potential, then the PMOS pull-up transistor 613 will be turned on to pull up the second data I/O line DIOS, however, if the read data on the second global I/O signal bus GIOS is at a logic 0 potential, then the NMOS pull-down transistor 615 will be turned on to pull down the second data I/O line DIOS.

Figure 7:
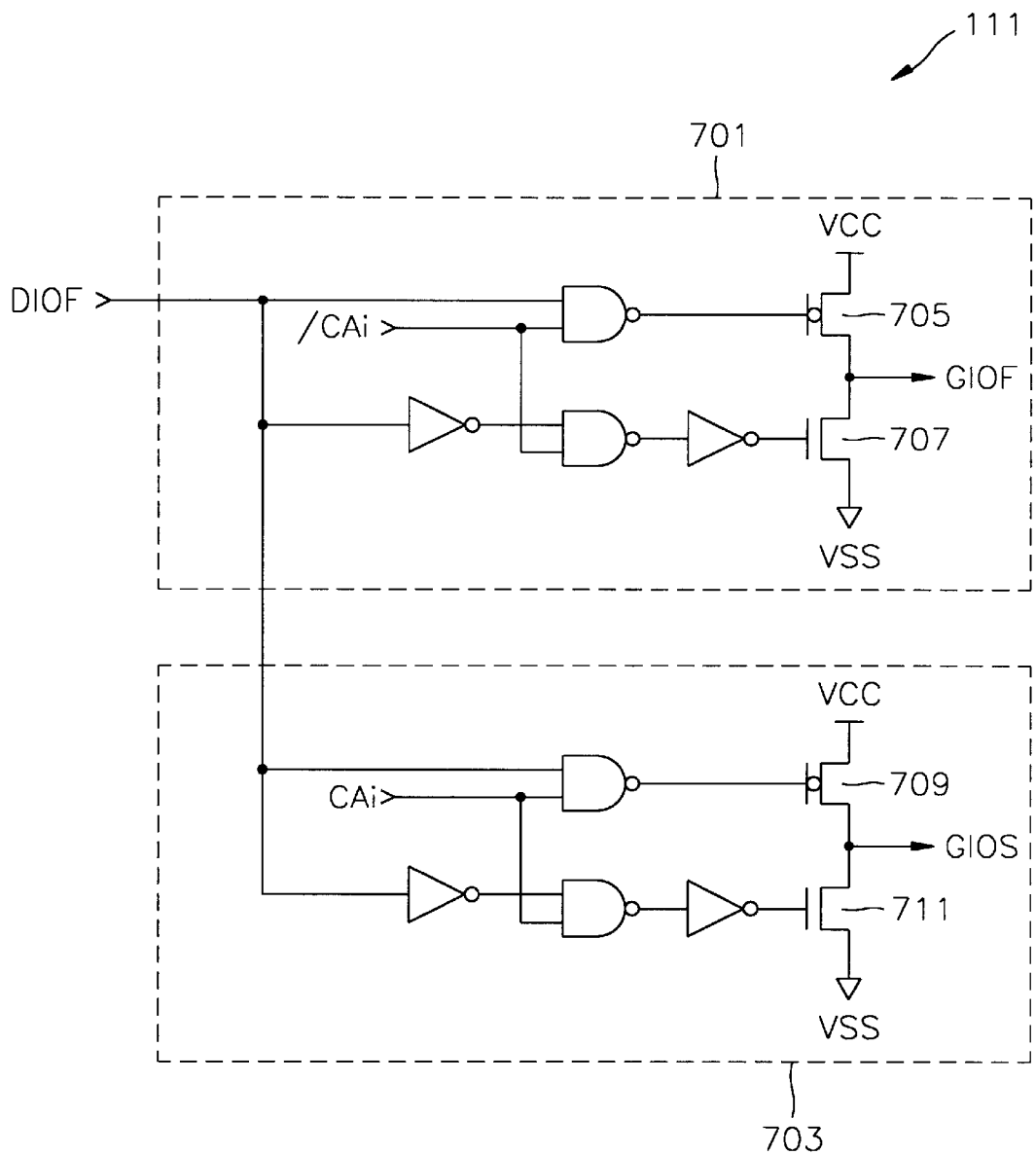
FIG. 7 is an electrical schematic of a first input driver according to the present invention.
Figure 8:
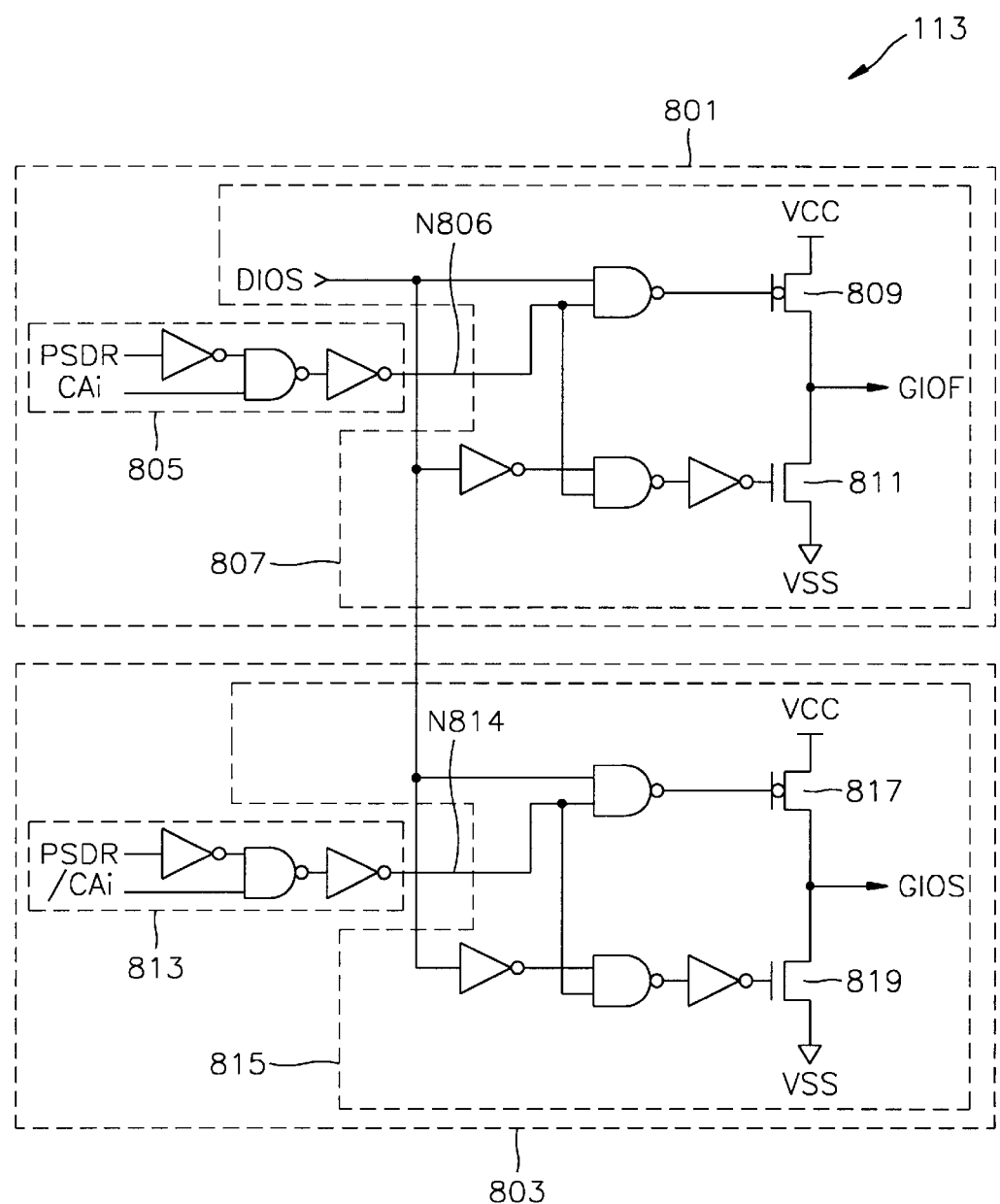
FIG. 8 is an electrical schematic of a second input driver according to the present invention.

Referring now to FIGS. 7–8, the first and second data input driver circuits 111 and 113 will be described in detail. In particular, the first data input driver circuit 111 of FIG. 7 includes a first global line driver 701 and a second global line driver 703. The first global line driver 701 receives input data from the first data I/O line DIOF and drives the first global I/O signal line GIOF with this input data (i.e., write data) if the complementary first column address signal /CAi is set to a logic 1 potential. Here, a logic 1 signal on DIOF will cause PMOS pull-up transistor 705 to turn on and pull up GIOF and a logic 0 signal on DIOF will cause NMOS pull-down transistor 707 to turn on and pull down GIOF. Alternatively, the second global line driver 703 receives input data from the first data I/O line DIOF and drives the second global I/O signal line GIOS with this input data (i.e., write data) if the first column address signal CAi is set to a logic 1 potential. Thus, a logic 1 signal on DIOF will cause PMOS pull-up transistor 709 to turn on and pull up GIOS and a logic 0 signal on DIOF will cause NMOS pull-down transistor 711 to turn on and pull down GIOS.

Referring now to FIG. 8, the second data input driver circuit 113 includes write circuits 801 and 803. Write circuit 801 includes a third global line driver 807 and a fifth rate/address decoder 805. Write circuit 803 includes a fourth global line driver 815 and a sixth rate/address decoder 813. As will be understood by those skilled in the art, the second data input driver circuit 113 is inactive when the memory device 100 is operating in a single data rate SDR mode. In particular, when the mode select signal PSDR is set to a logic 1 potential to designate a single data rate mode, then nodes N806 and N814 will be set to logic 0 potentials. When this occurs, PMOS transistors 809 and 817 and NMOS transistors 811 and 819 will be inactive and the outputs of the third and fourth global line drivers 807 and 815 will be held in high impedance states. Alternatively, during dual data rate DDR mode when PSDR=0, the value of the first column address signal CAi will determine whether data on the second data I/O line DIOS is to be written to the first memory cell array 117 (via the first global I/O signal line GIOF) or the second memory cell array 119 (via the second global I/O signal line GIOS). In particular, when CAi=1, then node N806 will be set to a logic 1 potential to thereby route data from signal line DIOS to signal line GIOF. But, when Cai=0, then node N814 will be set to a logic 1 potential to thereby route data from signal line DIOF to signal line GIOS.

The operations performed by the above-described circuits are summarized by TABLE 1.

TABLE 1

| | | CAi = 0 (write), CADi = 0 (read) | CAi = 1 (write), CADi = 1 (read) |
|---|---|---|---|
| SDR (PSDR = 1) | CSLF | ENABLED | DISABLED |
| | CSLS | DISABLED | ENABLED |
| | READ | GIOF → DIOF | GIOS → DIOF |
| | WRITE | DIOF → GIOF | DIOF → GIOS |
| DDR (PSDR = 0) | CSLF | ENABLED | ENABLED |
| | CSLS | ENABLED | ENABLED |
| | READ | GIOF → DIOF | GIOS → DIOF |
| | | GIOS → DIOS | GIOF → DIOS |
| | WRITE | DIOF → GIOF | DIOS → GIOF |
| | | DIOS → GIOS | DIOF → GIOS |

Figure 15:
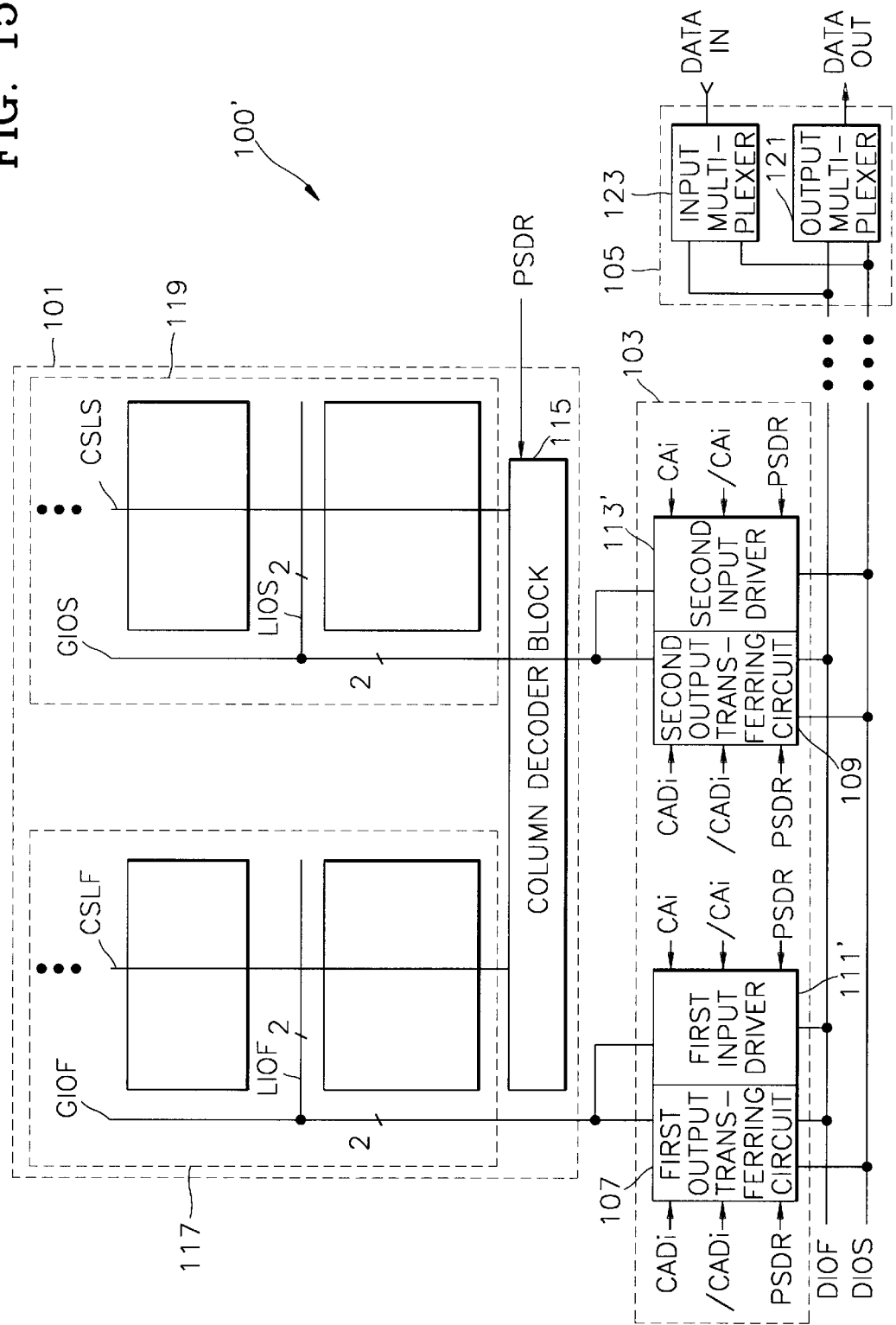
FIG. 15 is a block schematic of an integrated circuit memory device according to a second embodiment of the present invention.
Figure 16:
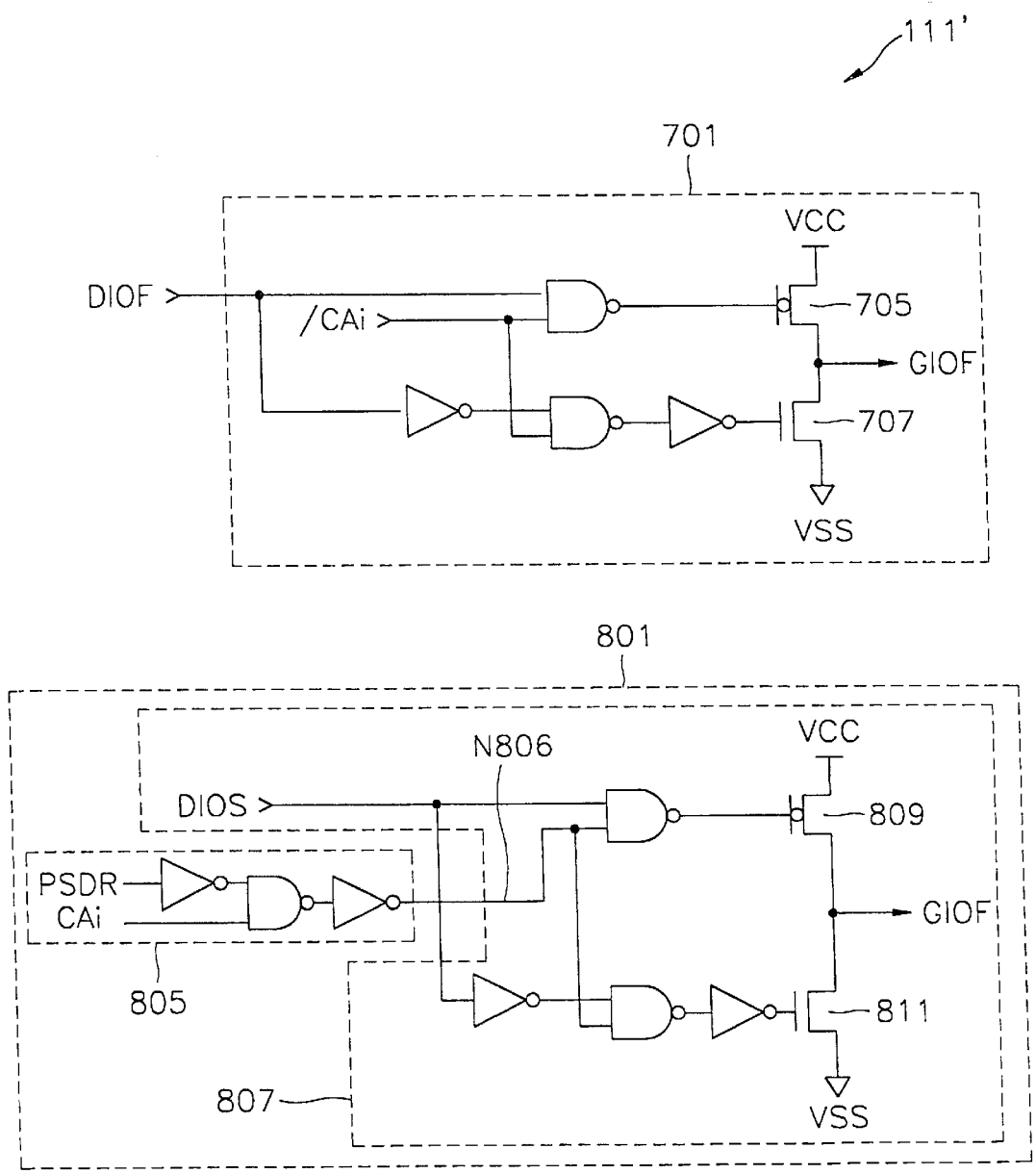
FIG. 16 is an electrical schematic of an alternative first input driver according to the second embodiment of the present invention.
Figure 17:
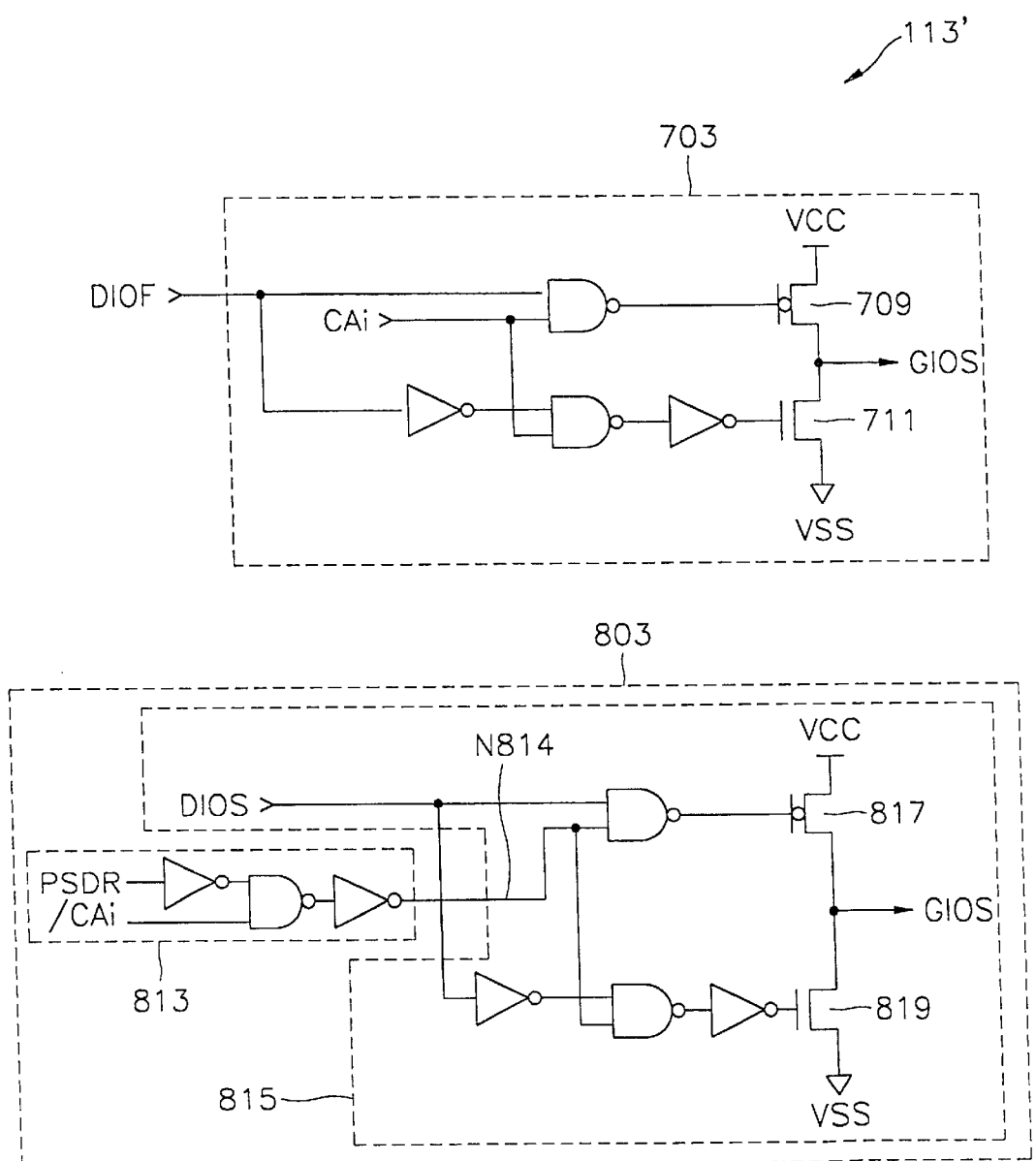
FIG. 17 is an electrical schematic of an alternative second input driver according to the second embodiment of the present invention.

Referring now to FIGS. 15–17, an alternative embodiment of a preferred integrated circuit memory device 100' is also illustrated. This embodiment is similar to the memory device 100 of FIG. 1, however, the first and second input drivers 111' and 113' illustrated by FIGS. 16 and 17 operate in both the single and dual data rate modes. Nonetheless, these circuits of FIGS. 15–17 also perform the operations illustrated by TABLE 1.

As illustrated by FIG. 1, the memory device 100 also includes an input and output controller 105. The input and output controller 105 includes an output multiplexer 121 and an input multiplexer 123. In the SDR mode, the output multiplexer 121 synchronizes data of the DIOF with the external clock CLK to be output externally. In the DDR mode, the output multiplexer 121 serially outputs data of the DIOF and data of the DIOS in response to rising and falling edges of the external clock CLK. In the SDR mode, the input multiplexer 123 transmits data received from the outside to the DIOF, synchronized with the external clock CLK. In the DDR mode, the input multiplexer 123, and transmits first and second input data received from the outside to the DIOF and the DIOS in response to the rising and falling edges of the external clock CLK.

Figure 9:
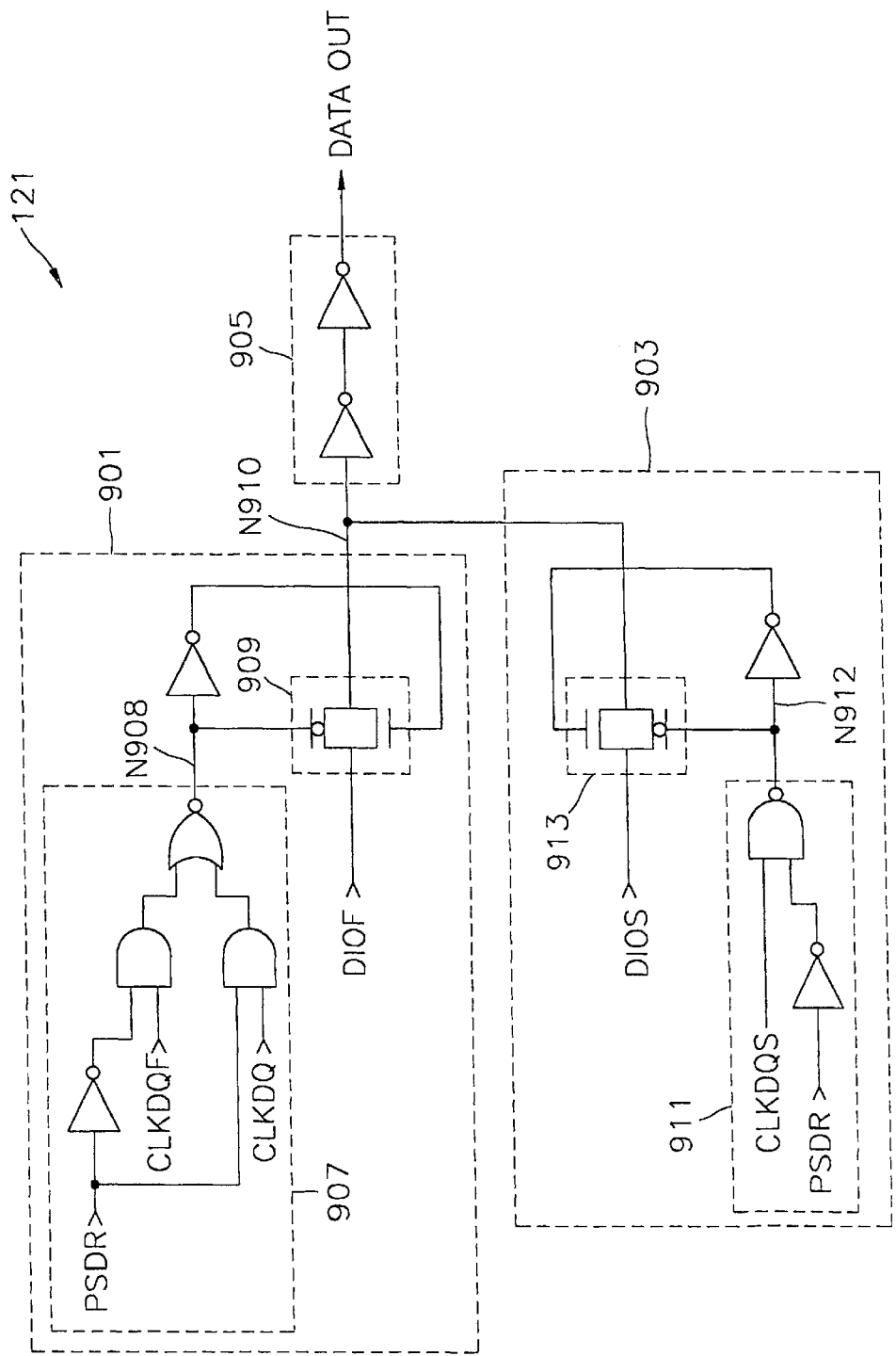
FIG. 9 is an electrical schematic of an output multiplexer according to the present invention.

Referring to FIG. 9, the output multiplexer 121 includes a normal output multiplexer 901 and a select output multiplexer 903. The normal output multiplexer 901 includes a control signal generator 907 and a transmission gate 909. When PSDR is 'high', an output signal N908 of the control signal generator 907 goes 'low' in synchronization with signal CLKDQ. In the SDR mode, signal CLKDQ is synchronized with the external clock CLK. In the DDR mode, i.e., when PSDR is 'low', the output signal N908 of the control signal generator 907 goes 'low' in synchronization with signal CLKDQF. In the DDR mode, signal CLKDQF is synchronized with the rising edges of the external clock CLK. The transmission gate 909 transmits the data of the DIOF when the output signal N908 of the control signal generator 907 is 'low'. Thus, the data of the DIOF is synchronized with the external clock CLK in the SDR mode, and with the rising edges of the external clock CLK in the DDR mode, and is transmitted to an external data line DATA OUT during a reading operation.

The select output multiplexer 903 includes a control signal generator 911 and a transmission gate 913. In the DDR mode, i.e., when the PSDR is 'low', an output signal N912 of the control signal generator 911 goes 'low' in response to signal CLKDQS. The CLKDQS of the DDR mode is synchronized with the falling edges of the external clock CLK. The transmission gate 913 transmits the data of the DIOS when the output signal N912 of the control signal generator 911 is 'low'. In the DDR mode, the data of the DIOS is synchronized with the falling edges of the external clock CLK, and is transferred to an external data line DATA IN. The level of a common output terminal N910 of the normal output multiplexer 901 and the select output multiplexer 903 is output to DATA OUT via a buffer 905.

Figure 10:
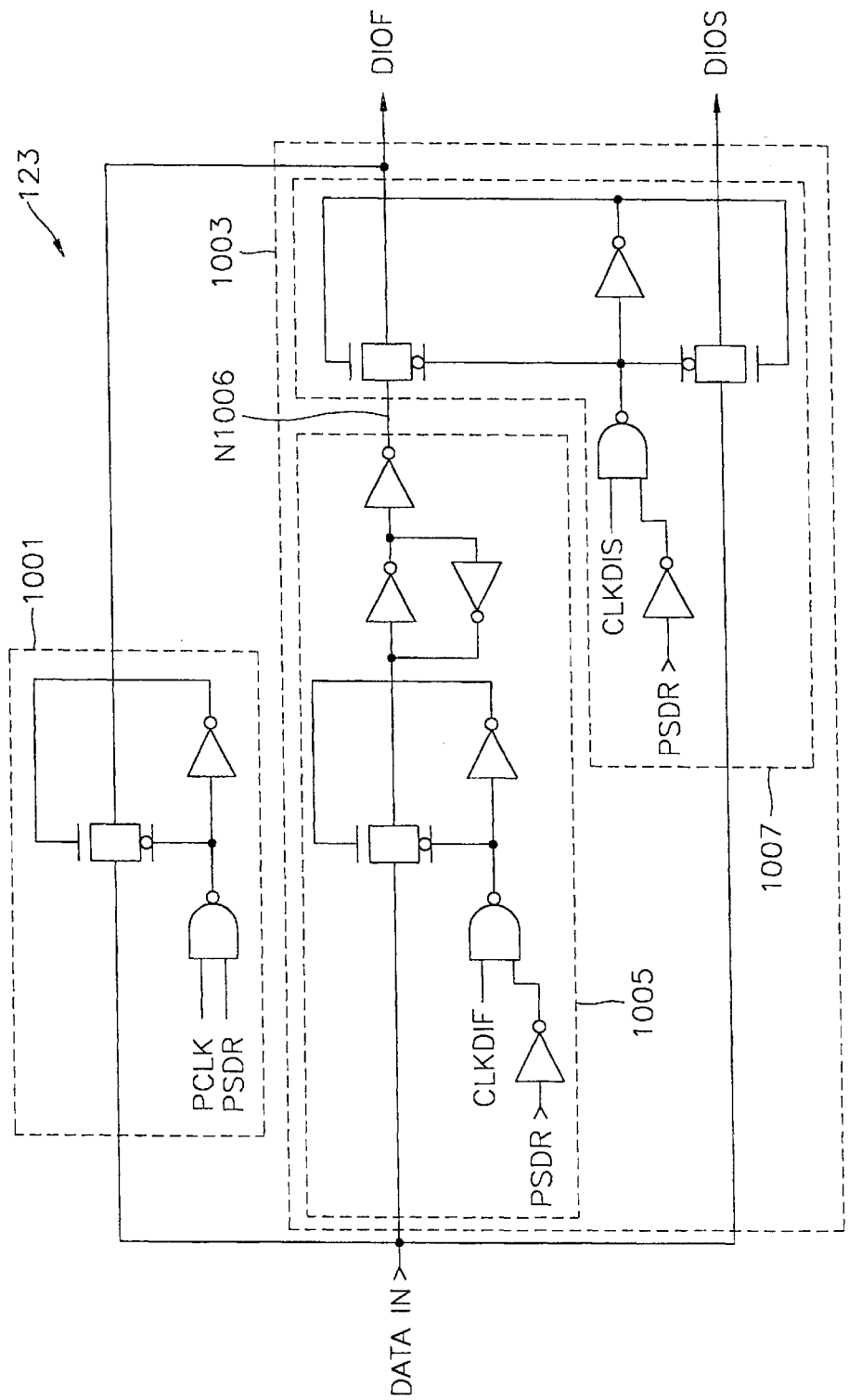
FIG. 10 is an electrical schematic of an input multiplexer according to the present invention.

Referring to FIG. 10, the input multiplexer 123 includes a first transmission portion 1001 and a second transmission portion 1003. The first transmission portion 1001 transmits data of an external input data line DATA IN to DIOF when the PSDR is 'high' and the PCLK is activated to 'high'. In the SDR mode, signal PCLK is synchronized with an external clock CLK. The second transmission portion 1003 includes a transmission latch 1005 and an output transmission portion 1007. The transmission latch 1005 latches the data of the input data line DATA IN when the PSDR is 'low' and the CLKDIF is activated to 'high'. In the DDR mode, the CLKDIF is synchronized with the rising edges of the external clock CLK. The output transmission portion 1007 outputs to the DIOF an output signal N1006 of the transmission latch portion 1005 when the PSDR is 'low' and the CLKDIS is activated to 'high'. At this time, the data of the DATA IN is output to the DIOS. In the DDR mode, the CLKDIS is synchronized with the falling edges of the external clock CLK. Accordingly, in the DDR mode, first input data received through the DATA IN is transmitted to the DIOF, and second input data is received by the DIOS. In the SDR mode, input data is received by the DIOF.

Figure 11:
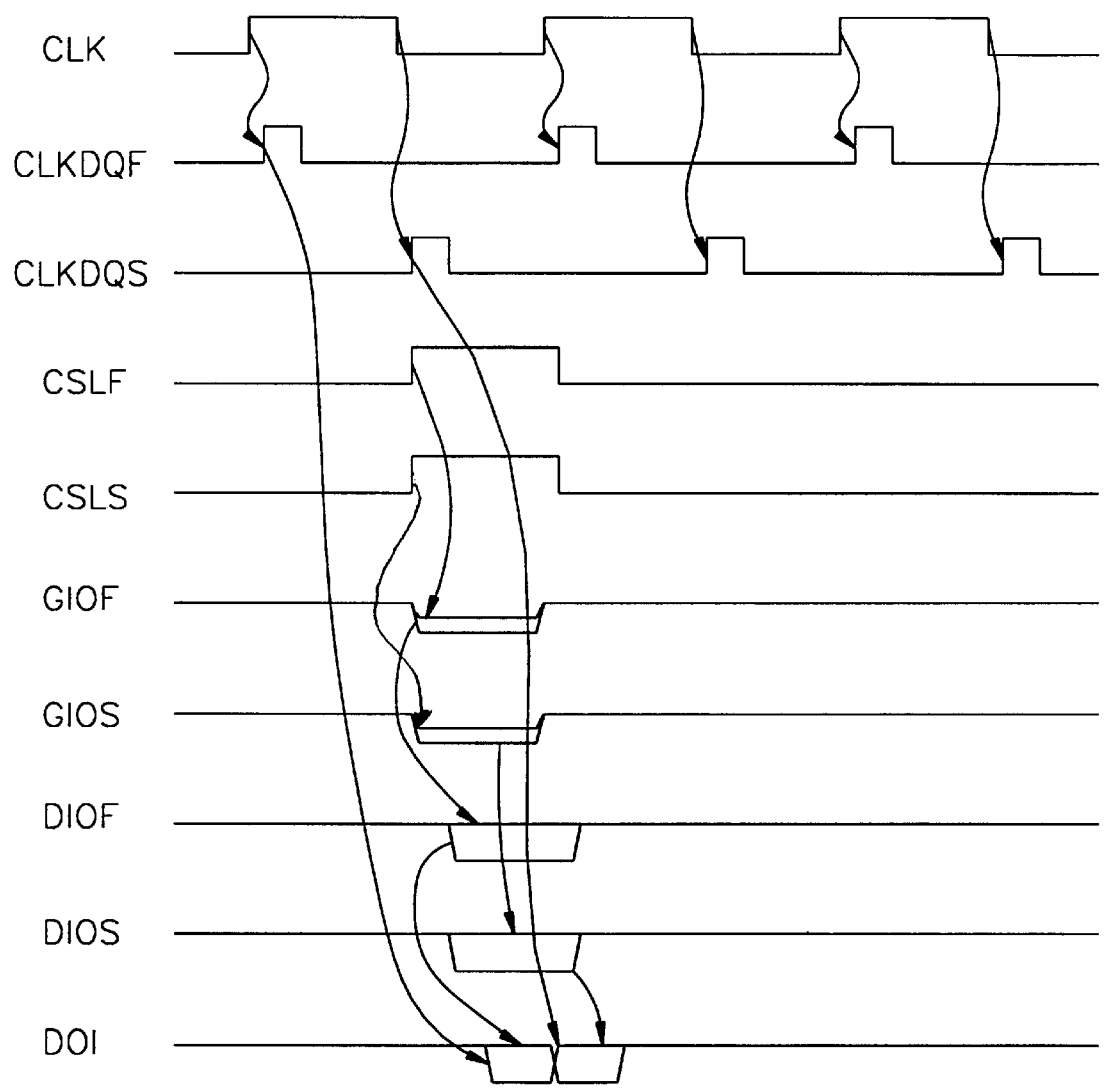
FIG. 11 is a timing diagram which illustrates operation of the memory device of FIG. 1 when outputting data in a dual data rate DDR mode.

Referring to FIG. 11, the CLKDQF and the CLKDQS are generated in synchronization with an external clock CLK. Two column select lines CSLF and CSLS are activated regardless of the logic state of a column address CAi. Data selected by the CSLF and the CSLS are transmitted to the DIOF and the DIOS via GIOF and GIOS. Also, the data of the DIOF is output to DATA OUT in response to the CLKDQF, and the data of the DIOS is output to the DATA OUT in response to the CLKDQS.

Figure 12:
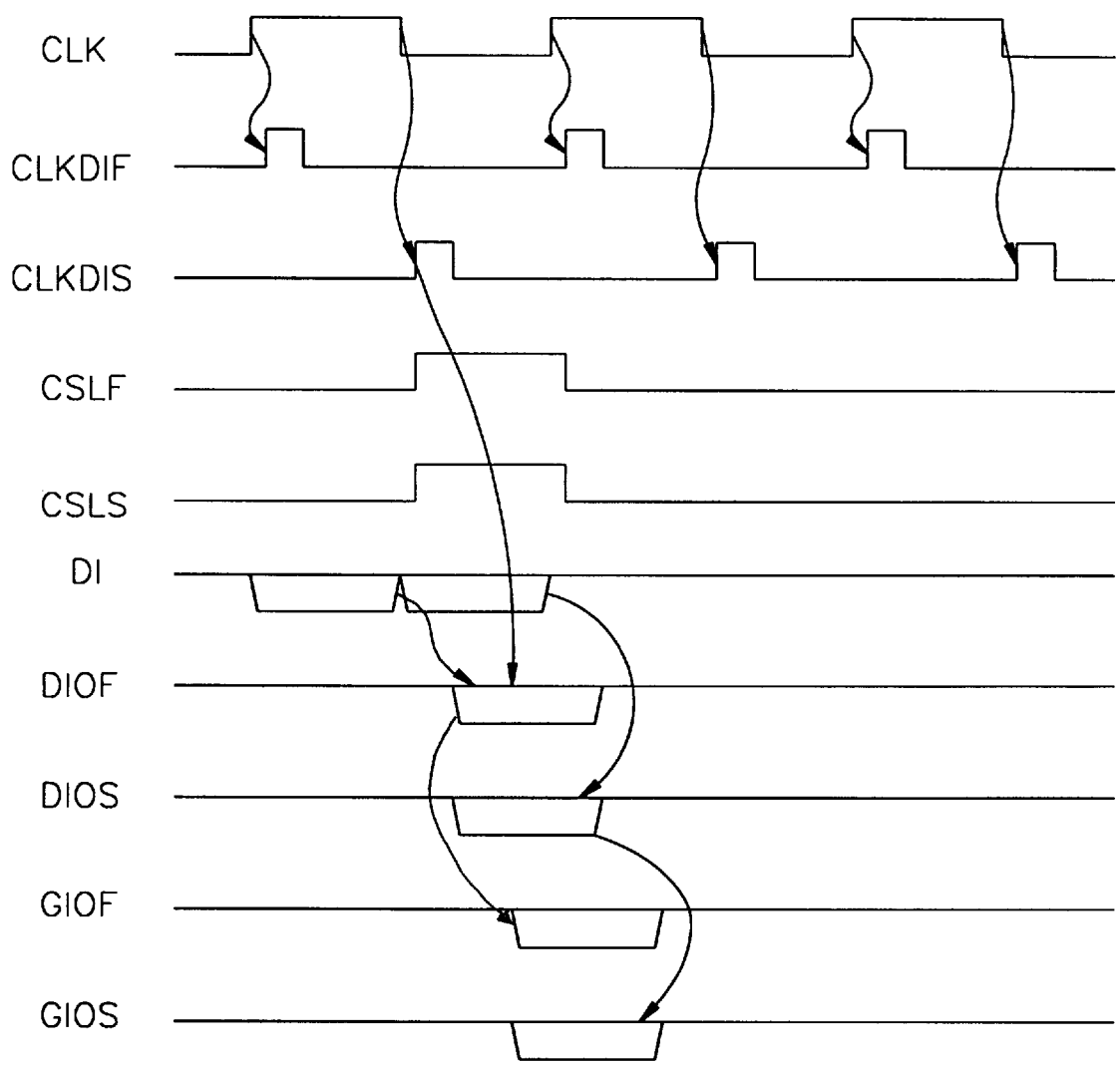
FIG. 12 is a timing diagram which illustrates operation of the memory device of FIG. 1 when inputting data in a dual data rate DDR mode.

Referring to FIG. 12, the CLKDIF and the CLKDIS are generated in synchronization with an external clock CLK. Two column select lines CSLF and CSLS are activated regardless of the logic state of the column address CAi. Also, data of the DATA IN serially received is transmitted to the DIOF in response to the CLKDIF, and to the DIOS in response to the CLKDIS. When the CAi is 'low', the data of the DIOF is transmitted to the GIOF and received by a memory cell of a column selected by the CSLF. When the CAi is 'high', the data of the DIOF is transmitted to the GIOS and received by a memory cell of a column selected by the CSLS, as illustrated by TABLE 1. In addition, when the CAi is 'low', the data of the DIOS is transmitted to the GIOS and received by a memory cell of a column selected by the CSLS. When the CAi is 'high', the data of the DIOS is transmitted to the GIOF and received by a memory cell of a column selected by the CSLF.

Figure 13:
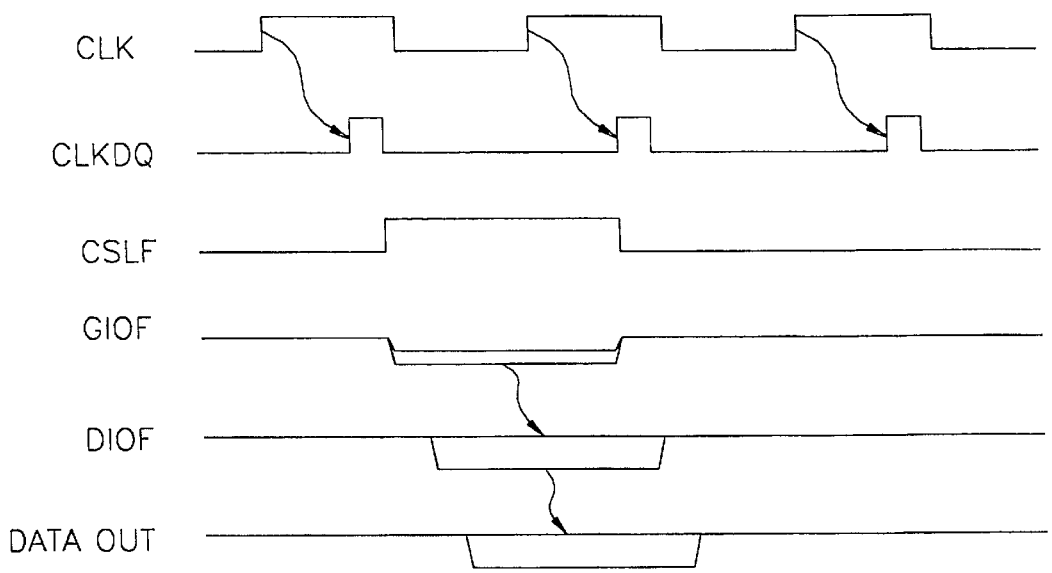
FIG. 13 is a timing diagram which illustrates operation of the memory device of FIG. 1 when outputting data in a dual data rate DDR mode.

Referring to FIG. 13, the CLKDQ is generated in synchronization with the external clock CLK. A column select line CSLF is activated for one half, in the figure clock period. Data selected by the CSLF is transmitted to the DIOF via the GIOF. Also, the data of the DIOF is output to the DATA OUT in response to the CLKDQ.

Figure 14:
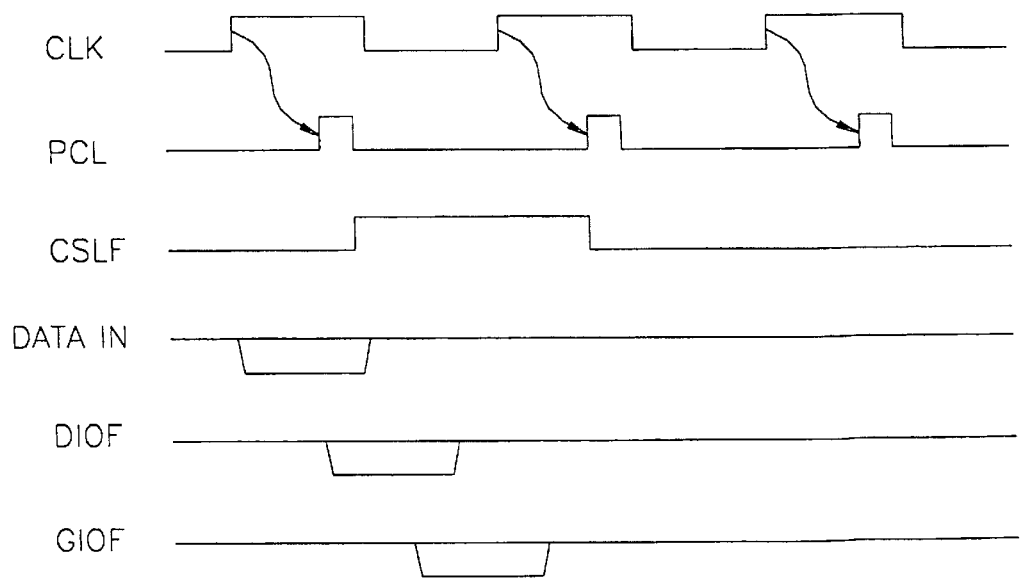
FIG. 14 is a timing diagram which illustrates operation of the memory device of FIG. 1 when inputting data in a dual data rate DDR mode.

Referring to FIG. 14, the PCLK is generated in synchronization with the external clock CLK. One column select line CSLF is activated for one clock period. The received data of the DATA IN is transmitted to the DIOF in response to the PCLK. The data of the DIOF is received by a memory cell of a column selected by the CSLF.

Thus, memory devices according to the present invention are capable of operating efficiently in a single data rate (SDR) mode or a double data rate (DDR) mode and this operating capability may lead to increases in productivity and reductions in manufacturing cost. In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of operating an integrated circuit memory device having first and second memory arrays therein, comprising the steps of:
   simultaneously transferring read data from the first and second memory arrays to first and second data lines, respectively, during a first read time interval, in response to a first address signal in a first logic state; and
   simultaneously transferring read data from the first and second memory arrays to the second and first data lines, respectively, during a second read time interval, in response to the first address signal in a second logic state opposite the first logic state.

2. The method of claim 1, further comprising the steps of:
   simultaneously transferring write data from the first and second data lines to the first and second memory arrays, respectively, during a first write time interval, in response to the first address signal in the first logic state; and
   simultaneously transferring write data from the first and second data lines to the second and first memory arrays, respectively, during a second write time interval, in response to the first address signal in the second logic state.

3. The method of claim 2, wherein the memory device has single and dual data rate modes; and wherein each of said simultaneously transferring steps occurs during the dual data rate mode.

4. The method of claim 3, further comprising the steps of:
   transferring read data from the first memory array to the first data line, in response to the first address signal in the first logic state during a single data rate mode; and
   transferring read data from the second memory array to the first data line, in response to the first address signal in the second logic state during a single data rate mode.

5. The method of claim 4, wherein said step of transferring read data from the first memory array to the first data line includes blocking transfer of data to or from the second memory array while the first address signal is in the first logic state; and wherein said step of transferring read data from the second memory array to the first data line includes blocking transfer of data to or from the first memory array while the first address signal is in the second logic state.

6. The method of claim 4, wherein said step of transferring read data from the first memory array to the first data line includes blocking transfer of data from the second memory array while the first address signal is in the first logic state; and wherein said step of transferring read data from the second memory array to the first data line includes blocking transfer of data from the first memory array while the first address signal is in the second logic state.

7. An integrated circuit memory device operable in single and dual data rate modes, comprising:
   first and second memory cell arrays;
   first and second global input/output signal lines electrically coupled to said first and second memory cell arrays, respectively; and
   means, responsive to a first address signal, for simultaneously transferring read data on said first and second global input/output lines to first and second data lines, respectively, during a first read time interval when the first address signal is in a first logic state and for simultaneously transferring read data on said first and second global input/output lines to the second and first data lines, respectively, during a second read time interval when the first address signal is in a second logic state opposite the first logic state.

8. The memory device of claim 7, wherein said simultaneously transferring means comprises:
   a first output transfer circuit having an input electrically coupled to said first global input/output signal line and first and second outputs electrically coupled to the first and second data lines, respectively;
   a second output transfer circuit having an input electrically coupled to said second global input/output signal line and first and second outputs electrically coupled to the first and second data lines, respectively;

a first input driver having an input electrically coupled to the first data line and first and second outputs electrically coupled to said first and second global input/output lines, respectively; and a second input driver having an input electrically coupled to the second data line and first and second outputs electrically coupled to said first and second global input/output lines, respectively.

9. The memory device of claim 7, wherein said simultaneously transferring means comprises:

a first output transfer circuit having an input electrically coupled to said first global input/output signal line and first and second outputs electrically coupled to the first and second data lines, respectively;

a second output transfer circuit having an input electrically coupled to said second global input/output signal line and first and second outputs electrically coupled to the first and second data lines, respectively;

a first input driver having first and second inputs electrically coupled to the first and second data lines, respectively, and an output electrically coupled to said first global input/output lines; and a second input driver having first and second inputs electrically coupled to the first and second data lines, respectively, and an output electrically coupled to said second global input/output line.

10. A semiconductor memory device operable in single and dual data rate modes, comprising:

first and second memory cell arrays, first and second global input/output signal lines electrically coupled to said first and second memory cell arrays, respectively; and means, responsive to a first address signal, for simultaneously transferring read data on said first and second global input/output lines to first and second data lines, respectively, during a first read time interval when the first address signal is in a first logic state and for simultaneously transferring read data on said first and second global input/output lines to the second and first data lines, respectively, during a second read time interval when the first address signal is in a second logic state opposite the first logic state.

11. The memory device of claim 10, wherein said simultaneously transferring means comprises:

a first output transfer circuit having an input electrically coupled to said first global input/output signal line and first and second outputs electrically coupled to the first and second data lines, respectively;

a second output transfer circuit having an input electrically coupled to said second global input/output signal line and first and second outputs electrically coupled to the first and second data lines, respectively;

a first input driver having an input electrically coupled to the first data line and first and second outputs electrically coupled to said first and second global input/output lines, respectively, and a second input driver having an input electrically coupled to the second data line and first and second outputs electrically coupled to said first and second global input/output lines, respectively.

12. The memory device of claim 10, wherein said simultaneously transferring means comprises:

a first output transfer circuit having an input electrically coupled to said first global input/output signal line and first and second outputs electrically coupled to the first and second data lines, respectively;

a second output transfer circuit having an input electrically coupled to said second global input/output signal line and first and second outputs electrically coupled to the first and second data lines, respectively;

a first input driver having first and second inputs electrically coupled to the first and second data lines, respectively, and an output electrically coupled to said first global input/output line; and a second input driver having first and second inputs electrically coupled to the first and second data lines, respectively, and an output electrically coupled to said second global input/output line.

13. A semiconductor memory device operable in single and dual data rate modes, comprising:

first and second memory cell arrays, first and second global input/output signal lines electrically coupled to said first and second memory cell arrays, respectively;

a column decoder for selecting a column of the semiconductor memory device in response to one selected from a group of column addresses including a predetermined column address, in the single data rate mode, and in response to one selected from the group of column addresses excluding the predetermined column address, in the dual data rate mode; and means, responsive in a first address signal, for simultaneously transferring read data on said first and second global input/output lines to first and second data lines, respectively, during a first read time interval when the first address signal is in a first logic state and for simultaneously transferring read data on said first and second global input/output lines to the second and first data lines, respectively, during a second read time interval when the first address signal is in a second logic state opposite the first logic state.

14. The memory device of claim 13, wherein said simultaneously transferring means comprises:

a first output transfer circuit having an input electrically coupled to said first global input/output signal line and first and second outputs electrically coupled to the first and second data lines, respectively;

a second output transfer circuit having an input electrically coupled to said second global input/output signal line and first and second outputs electrically coupled to the first and second data lines, respectively;

a first input driver having an input electrically coupled to the first data line and first and second outputs electrically coupled to said first and second global input/output lines, respectively; and a second input driver having an input electrically coupled to the second data line and first and second outputs electrically coupled to said first and second global input/output lines, respectively.

15. The memory device of claim 13, wherein simultaneously transferring means comprises:

a first output transfer circuit having an input electrically coupled to said first global input/output signal line and first and second outputs electrically coupled to the first and second data lines, respectively;

a second output transfer circuit having an input electrically coupled to said second global input/output signal line and first and second outputs electrically coupled to the first and second data lines, respectively;

a first input driver having an input electrically coupled to the first and second data lines, respectively, and an output electrically coupled to said first global input/output lines; and a second input driver having first and second inputs electrically coupled to the first and second data lines, respectively, and an output electrically coupled to said second global input/output lines.

16. A semiconductor memory device operable in single and dual data rate modes, comprising:

first and second memory cell arrays;

first and second global input/output signal lines electrically coupled to said first and second memory cell arrays, respectively;

means, responsive to a first address signal, for simultaneously transferring read data on said first and second global input/output lines to first and second data lines, respectively, during a first read time interval when the first address signal is in a first logic state and for simultaneously transferring read data on said first and second global input/output lines to the second and first data lines, respectively, during a second read time interval when the first address signal is in a second logic state opposite the first logic state; and a mode select signal portion for generating a mode select signal.

17. The memory device of claim 16, wherein said mode select signal is a test signal for testing the semiconductor memory device operative in the dual data rate mode.

18. The memory device of claim 16, wherein said mode select signal is a signal for selecting the single data rate mode or the dual data rate mode.

19. The memory device of claim 16, wherein the simultaneously transferring means comprises;

a first output transfer circuit having an input electrically coupled to said first global input/output signal line and first and second outputs electrically coupled to the first and second data lines, respectively;

a second output transfer circuit having an input electrically coupled to said second global input/output signal line and first and second outputs electrically coupled to the first and second data lines, respectively;

a first input driver having an input electrically coupled to the first data line and first and second outputs electrically coupled to said first and second global input/output lines, respectively; and a second input driver having an input electrically coupled to the second data line and first and second outputs electrically coupled to said first and second global input/output lines, respectively.

20. The memory device of claim 16, wherein said simultaneously transferring means comprises:

a first output transfer circuit having an input electrically coupled to said first global input/output signal line and first and second outputs electrically coupled to the first and second data lines, respectively;

a second output transfer circuit having an input electrically coupled to said second global input/output signal line and first and second outputs electrically coupled to the first and second data lines, respectively;

a first input driver having first and second inputs electrically coupled to the first and second data lines, respectively, and an output electrically coupled to said first global input/output line; and a second input driver having first and second inputs electrically coupled to the first and second data lines, respectively, and an output electrically coupled to said second global input/output line.

21. The memory device of claim 16, wherein said mode select signal portion comprises:

a MOS transistor having a source, the source connected to a power supply voltage or a ground voltage; and a fuse, capable of being cut from the outside, having a first terminal connected to the power supply voltage or the ground voltage, and a second terminal connected to a drain of the MOS transistor, to generate the mode select signal.

22. A method of operating a semiconductor memory device having first and second memory arrays therein, comprising the steps of:

simultaneously transferring read data from the first and second memory arrays to first and second data lines, respectively, during a first read time interval, in response to a first address signal in a first logic state during a dual data rate mode;

simultaneously transferring read data from the first and second memory arrays to the second and first data lines, respectively, during a second read time interval, in response to the first address signal in a second logic state opposite the first logic state during the dual data rate mode;

transferring read data from the first memory array to the first data line, in response to the first address signal in the first logic state during a single data rate mode; and transferring read data from the second memory array to the first data line, in response to the first address signal in the second logic state during the single data rate mode.

23. The method of claim 22, further comprising the steps of:

simultaneously transferring write data from the first and second data lines to the first and second memory arrays, respectively, during a first write time interval, in response to the first address signal in the first logic state; and simultaneously transferring write data from the first and second data lines to the second and first memory arrays, respectively, during a second write time interval, in response to the first address signal in the second logic state.

* * * * *

UNITED STATES PATENT AND TRADEMARK OFFICE
CERTIFICATE OF CORRECTION

PATENT NO.    : 6,282,128 B1                                        Page 1 of 1
DATED         : August 28, 2001
INVENTOR(S)   : Sang-bo Lee It is certified that error appears in the above-identified patent and that said Letters Patent is hereby corrected as shown below:

<u>Title page,</u>
Item [56], References Cited, U.S. PATENT DOCUMENTS, please add the following after "5818785"

| | | | | |
|---|---|---|---|---|
| -- | 5,991,232 | 11/1999 | Matsumura et al. | 365/233 |
| | 5,973,989 | 10/1999 | Pawlowski | 365/233 |
| | 5,726,950 | 03/1998 | Okamoto | 354/233 |
| | 5,680,365 | 10/1997 | Blankenship | 365/230.05 |
| | 5,513,327 | 04/1996 | Farmwald et al. | 395/309 -- |

Please add the following FOREIGN DOCUMENTS
-- 2 285 156 A   06/1995   Great Britain

OTHER DOCUMENTS

Search Report, GB9808824.8, July 15, 1998 --

<u>Column 12,</u>
Line 55, please insert -- said -- after "wherein".
Line 66, please change "an input" to -- first and second inputs --.

Signed and Sealed this

Sixth Day of August, 2002

Attest:

*Attesting Officer*

JAMES E. ROGAN
*Director of the United States Patent and Trademark Office*